United States Patent [19]

Murphy et al.

[11] Patent Number: 4,827,259

[45] Date of Patent: May 2, 1989

[54] CIRCUIT FOR HIGH-FREQUENCY SAMPLING AND COMPRESSION OF DATA FOR HIGH-FREQUENCY ELECTRICAL TRANSIENT SIGNALS SUPERIMPOSED IN A LOW FREQUENCY STEADY-STATE SIGNAL

[75] Inventors: Richard J. Murphy, Clifton Park, N.Y.; Glenn D. Baker, Wayne, N.J.

[73] Assignee: Electric Power Research Institute, Palo Alto, Calif.

[21] Appl. No.: 207,888

[22] Filed: Jun. 14, 1988

Related U.S. Application Data

[63] Continuation of Ser. No. 926,674, Nov. 4, 1986, abandoned.

[51] Int. Cl.[4] .............................................. H03M 1/54
[52] U.S. Cl. .................................... 341/123; 341/164; 364/487; 318/636; 328/151
[58] Field of Search ................. 341/122–125, 341/132, 155, 158, 164, 166; 364/178, 179, 480, 481, 487; 358/138; 318/636; 381/30, 31; 328/150, 151

[56] References Cited

U.S. PATENT DOCUMENTS

| | | | |
|---|---|---|---|
| 3,591,779 | 7/1971 | Sutherland | 328/151 |
| 4,050,062 | 9/1977 | Crocker et al. | 340/825.57 X |
| 4,161,782 | 7/1979 | McCracken | 364/571 |
| 4,183,087 | 1/1980 | Huelsman | 364/515 |
| 4,232,364 | 11/1980 | Bibbero | 318/636 |
| 4,393,371 | 7/1983 | Morgan-Smith | 328/151 X |
| 4,495,586 | 1/1985 | Andrews | 364/487 |
| 4,568,912 | 2/1986 | Kitamura et al. | 340/347 AD X |

OTHER PUBLICATIONS

Anderholm, Time-Tag Generator for Variable Sampling Rate——, IBM Tech. Discl. Bul., vol. 8, No. 11, 4/1966, pp. 1520 & 1521.

The Engineering Staff of Analog Devices, Inc., Analog-Digital Conversion Handbook, 6/1972, pp. I-1 to I-11.

Primary Examiner—Bernard Roskoski
Assistant Examiner—Brian Young
Attorney, Agent, or Firm—Flehr, Hohbach, Test, Albritton & Herbert

[57] ABSTRACT

A circuit samples and stores high frequency transient events that affect low frequency steady state signals. The circuit digitizes the high frequency transient signal and samples the digital signals. The present and previously stored data samples are compared, and if the difference exceeds a threshold, the present sample is stored in memory, if the memory is not full, and simultaneously the internal counter is reset. If a number of successive samples do not exceed the threshold and are not stored within a defined interval, the last sample of the interval is stored and an interval counter is reset to zero. A logic circuit controls the timing and operation of the counter and storage of the sampled data.

7 Claims, 4 Drawing Sheets

CIRCUIT FOR HIGH-FREQUENCY SAMPLING AND COMPRESSION OF DATA FOR HIGH-FREQUENCY ELECTRICAL TRANSIENT SIGNALS SUPERIMPOSED IN A LOW FREQUENCY STEADY-STATE SIGNAL

This is a continuation of application Ser. No. 926,674 now abandoned filed Nov. 4, 1986.

TECHNICAL FIELD

This invention relates to a method and means for sampling high frequency electrical transient signals that are superimposed on other low frequency steady state signals and in particular to a method and means for rapidly sampling and storing short duration transient events for subsequent analysis.

BACKGROUND ART

Electrical power distribution equipments are subject to transient electrical events, such as lightning, which affect the voltages and currents generated by the equipment. Power utility companies find it necessary to monitor and analyze the effect of such events by recording and analyzing data relating to the voltages and currents developed by such transient phenomena so that proper protection and safeguards for maintaining the electrical stability of the power distribution equipment can be provided. These transient electrical events are of relatively short duration and generate high frequency voltages or currents.

The prior art approach was to sample data for short intervals at a high frequency to capture fast rise times or to sample at a lower frequency and forego the capture of the high frequency events. By way of example, a prior art system sampling a 60 Hz waveform with a high frequency additive pulse may have a memory consisting of 2,048 words of 24 bytes each, in which an analog-to-digital converter samples had a 5 MHz rate with 8 bit resolution. The fixed sampling system captures and includes high frequency components with 200 nanoseconds between sampling points. However, the total recorded time would be 1.2 milliseconds, assuming data packing of three samples per word for a total of 6144 words. In such a case, only a fraction of a single cycle at 60 Hz could be reconstructed, which which would provide little definition of the 60 Hz waveform on which the high frequency spike was superimposed. Also, in prior art systems two or three different sampling rates were utilized as a tradeoff between the two approaches.

Another alternative is to use very large memories or to vary in a predetermined manner the sampling rate referenced to a trigger point. However, large capacity memories are characterized by high power consumption, undue costs, increased complexity and a reduction in reliability, whereas fixed sampling sequences generally experience a loss of important data, such as a repeat strike of lightning.

SUMMARY OF THE INVENTION

In accordance with this invention, a method and system for capturing and analyzing the effect of short duration transient electrical events on relatively low frequency electrical networks is provided. To achieve the desired result of conserving storage memory of a digitally sampled waveform, the novel system includes an analog-to-digital converter that samples an input signal at a predetermined high frequency rate. Variations in the input signal are compared with a predetermined threshold value by a comparator. Control logic circuitry coupled to the comparator triggers a latch circuit to receive and store a present sample, whenever the absolute value of the difference between the present sample and the previously stored sample is greater than the threshold value. Each time that a sample is sensed, but not stored, a counter is incremented. Data stored in the memory consists of a sample value and a number representing a clock pulse count, which allows the input signal to be reconstructed and analyzed. The data is sampled at different rates, depending on whether the threshold is exceeded, thereby indicating an event or region of interest.

BRIEF DESCRIPTION OF THE DRAWINGS

The invention will be described in greater detail with reference to the drawings in which.

DESCRIPTION OF THE PREFERRED EMBODIMENT

Figure 1:
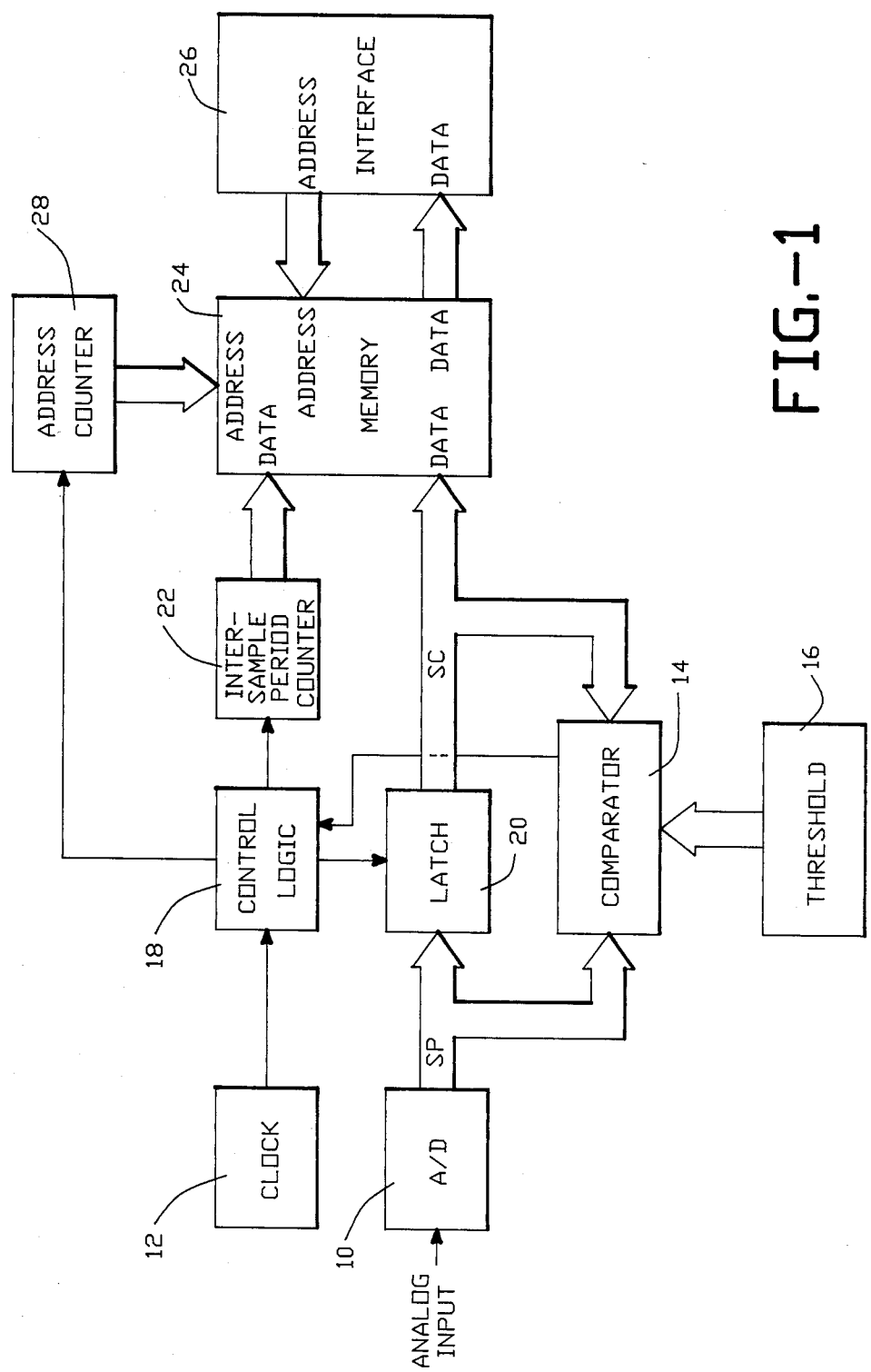
FIG. 1 is a block circuit diagram of the signal sampling and storage circuit network of this invention.

With reference to FIG. 1, a transient signal, such as a lightning flash that impacts a power distribution network, is received by an analog-to-digital converter (A/D) 10 which is provided at the input of the signal sampling and storage circuit disclosed herein. The A/D converter 10 samples the transient input signal, which may have a duration of a few microseconds, at a fixed predetermined high frequency rate, such as 5 MHz for example. The sampling rate of the system, which is a variable rate at which data is stored in memory, changes as a function of the input signal waveform. For example, the system sampling rate may vary from 5 MHz to less than 100 Hz.

The A/D converter always provides a digital output signal representing a present sample (SP) to a latch circuit 20. It also provides the value of the present sample signal SP to the memory, if the value meets the criteria. The value of the last stored sample SL, which is retained by the latch 20, is compared by a comparator 14 with the present sample SP. If the comparator 14 senses that the absolute value of the difference between the present sample SP and the last stored sample SL is greater than a threshold value which has been set in a threshold circuit 16, then the present sample SP is stored in the latch 20 and also in a memory 24. The threshold is set at a value of one so that, in effect when the magnitude of the difference of sample SP and sample SL is greater than or equal to two quantization levels, the sample data is stored. The threshold is a function of system noise and A/D converter resolution and therefore can be a value other than one. The memory 24 stores data which includes a sample value and the number of clock periods that have elapsed since the previously stored value. When the absolute value of the difference between the present sample SP and the last stored sample SL is greater than the threshold value, the count in an intersample period counter 22 is also stored in the memory 24, and an address counter 28 is incremented by one. The intersample period counter 22 and the address counter 28 are activated by a control logic circuit 18 which is timed by a clock circuit 12. The difference signal from the comparator 14 determines whether the control logic 18 (a) stores the present sample SP and the count in the intersample period counter, and increments the address counter 28 by one, when the difference signal is greater than the threshold, or (b) increments the intersample period counter 22 by one when the difference is below or equal to the threshold.

The memory 24 is also coupled to a microprocessor (not shown) which gates a desired address location to the memory chips to read or write data. The control logic circuit 18 provides signals to the address counter 28 so that sequential memory registers are accessed starting from the microprocessor selected location. Each time the address counter is incremented in response to the control logic 18, a value is stored in the memory 24 to reflect the number of samples that have occurred in succession having an absolute value that is less than or equal to the threshold, i.e., the value in the intersample period counter. Signal changes which appear at the analog input to the A/D converter 10 that result in differences less than or equal to the set threshold value are not significant and therefore are not recorded as data in the memory.

Figure 2:
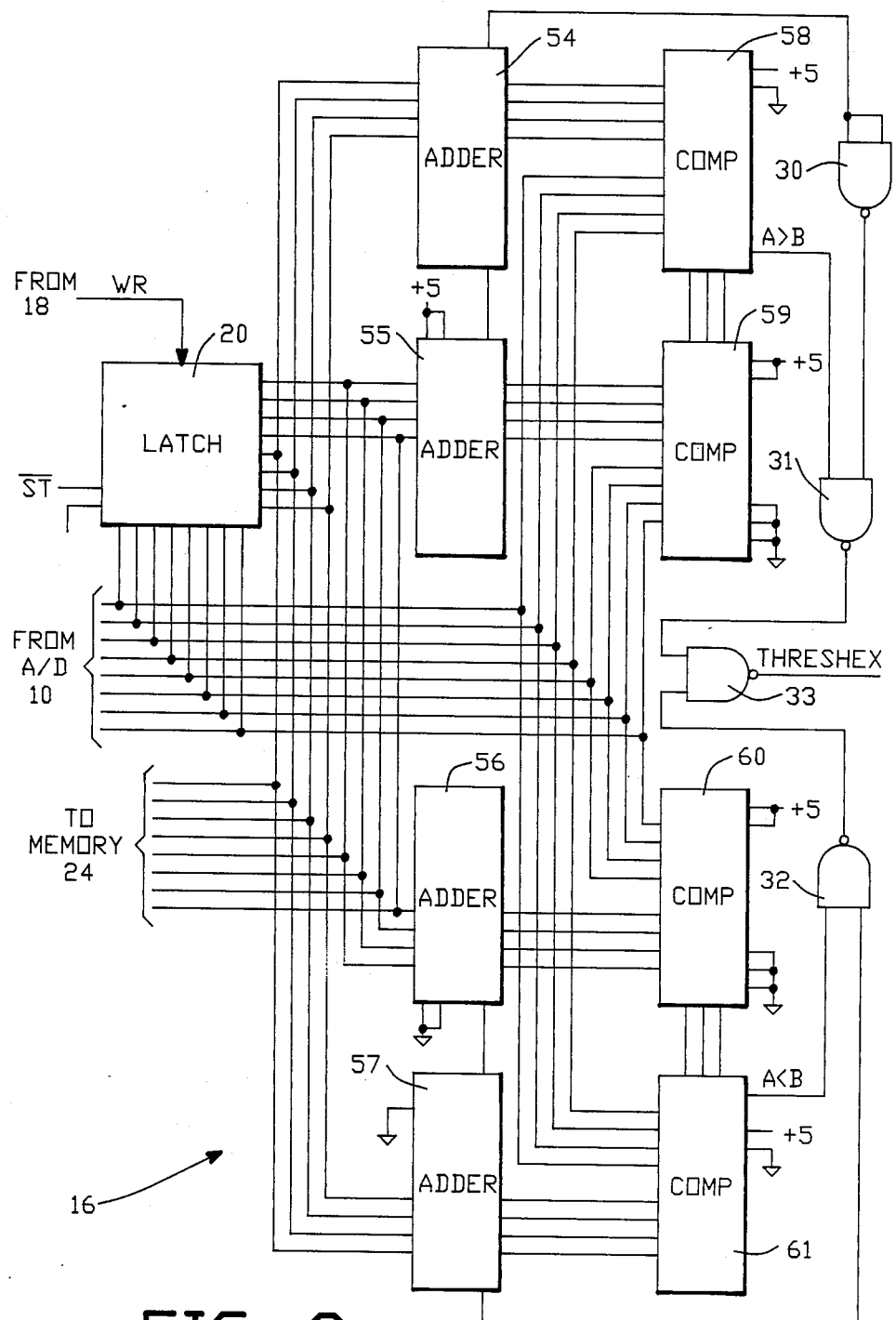
FIG. 2 is a schematic circuit diagram of the threshold/comparator employed in the network of FIG. 1.

FIG. 2 illustrates the circuitry for the threshold circuit 16 and comparator circuit 14 of the signal sampling and storage circuit. The threshold/comparator circuitry includes interconnected adders 54–57, comparator stages 58–61 and logic NAND gates 30–33.

During operation of the sampling and storage circuit, the latch 20 receives the present sample SP from the analog-to-digital converter 10. The sample SP is processed as a digital signal of 8 parallel bits across the data bus. It should be understood that the digital signals that are described with reference to FIG. 2 are processed and transferred in groups of parallel bits across a data bus between certain stages of the circuit network as illustrated in the drawing.

A write control signal WR derived from the control logic 18 controls the writing of data into the latch 20. The latch 20 provides 8 bit output signals to adders 54–57 in groups of 4 bits that determine the threshold to be used for comparison of the incoming present data sample and the last stored sample. For example, the adders 54, 55 provide a sum of the last stored sample plus the threshold (SL+T) and the adders 56, 57 provide a difference of last stored sample minus the threshold (SL−T). Comparators 58, 59 compare SL+T with the present sample, SP, for over threshold, and comparators 60, 61 compare SL−T with the present sample, SP, for underthreshold. The comparators 58–61 sense the difference between the SP and SL data samples, as described, to determine whether the absolute value of the difference is greater than the threshold. If so, logic NAND gates 30–33 are triggered to produce a threshold exceeded signal THRESHEX at the output of NAND gate 33. An additional function of gates 30–32 is to inhibit THRESHEX from being asserted during over and under range conditions. The signal output from the logic gate 33 is a threshold exceeded signal THRESHEX whenever changes in the incoming data signal result in conversion differences greater than the existing threshold level. Simultaneously, a status signal ST which is obtained from a bistable multivibrator or flip-flop is applied to the input circuit of the latch 20 and enables the WR status of the latch, thereby allowing data to be passed from the latch 20 across the data bus to the memory 24.

Figure 3:
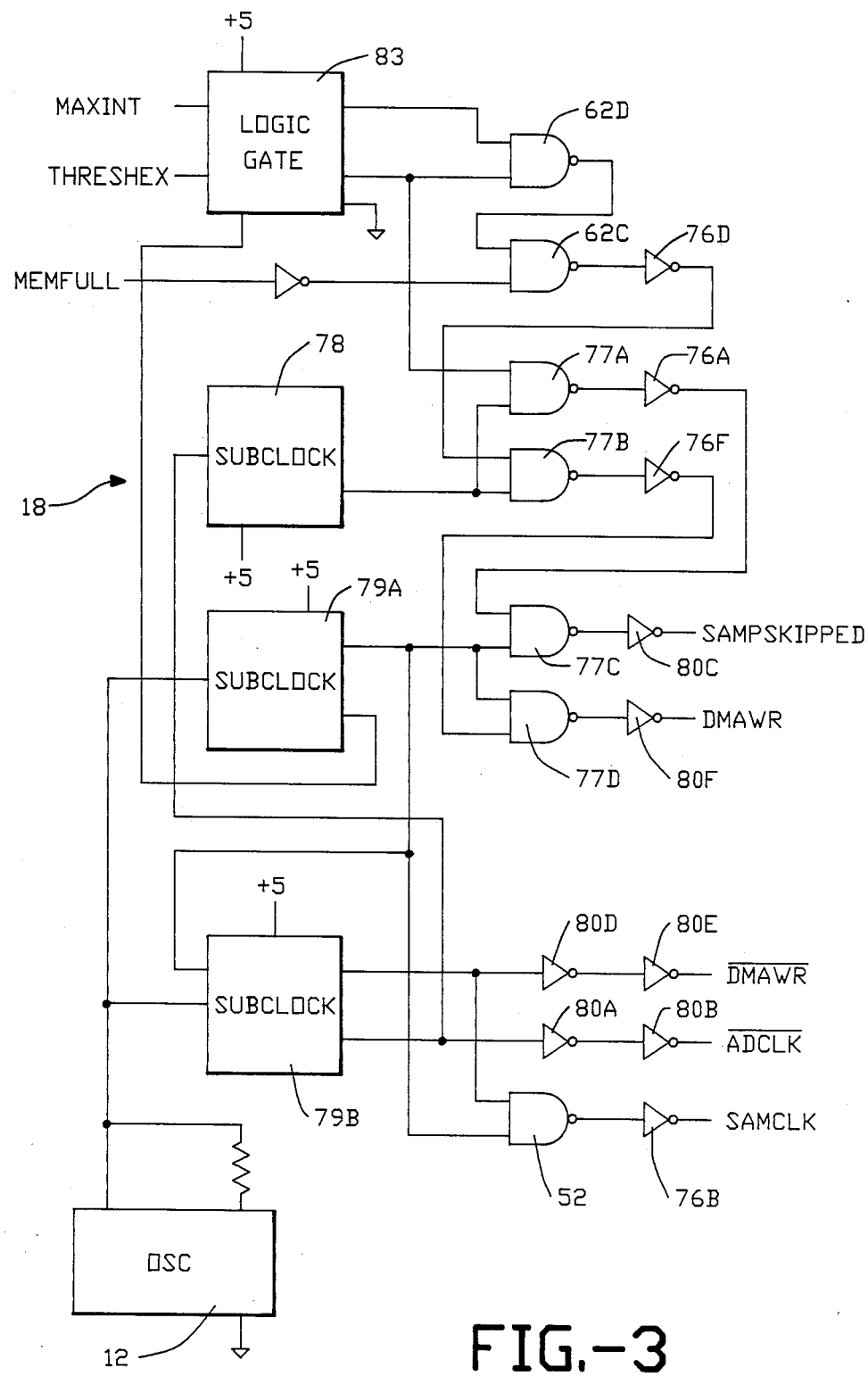
FIG. 3 is a schematic circuit diagram of the control logic incorporated in the network of FIG. 1.

With reference to FIG. 3, the THRESHEX output from the comparator 16 is directed to the control logic circuit 18 which is controlled by the clock 12. The clock oscillator 12 operates at a 20 MHz frequency, by way of example, and provides timing control of the internal circuitry of the sampling and storage network. As shown in FIG. 3, the THRESHEX signal is applied to a logic gate 83 in conjunction with a maximum interval signal MAXINT representing the maximum interval that the counters of the intersample period counter circuit 22 can stored. When enabled, the gate 83 provides an output to NAND gates 62D and 77A, which activate interconnected NAND gates 62C, 77B, 77C and 77D, and in turn inverters 76D, 76F, 79A, 80C and 80F, provided that the memory 24 is not full. The output from the control logic is a sample skipped signal SAMPSKIPPED when data is not to be passed to memory. This occurs if the threshold has not been exceeded and if the maximal interval that the intersample period counter can store data has not been reached. When the threshold has been exceeded or the maximum interval that the intersample period counter can store data has been reached, the control logic circuit provides a write pulse WR provided the memory is not full.

Figure 4:
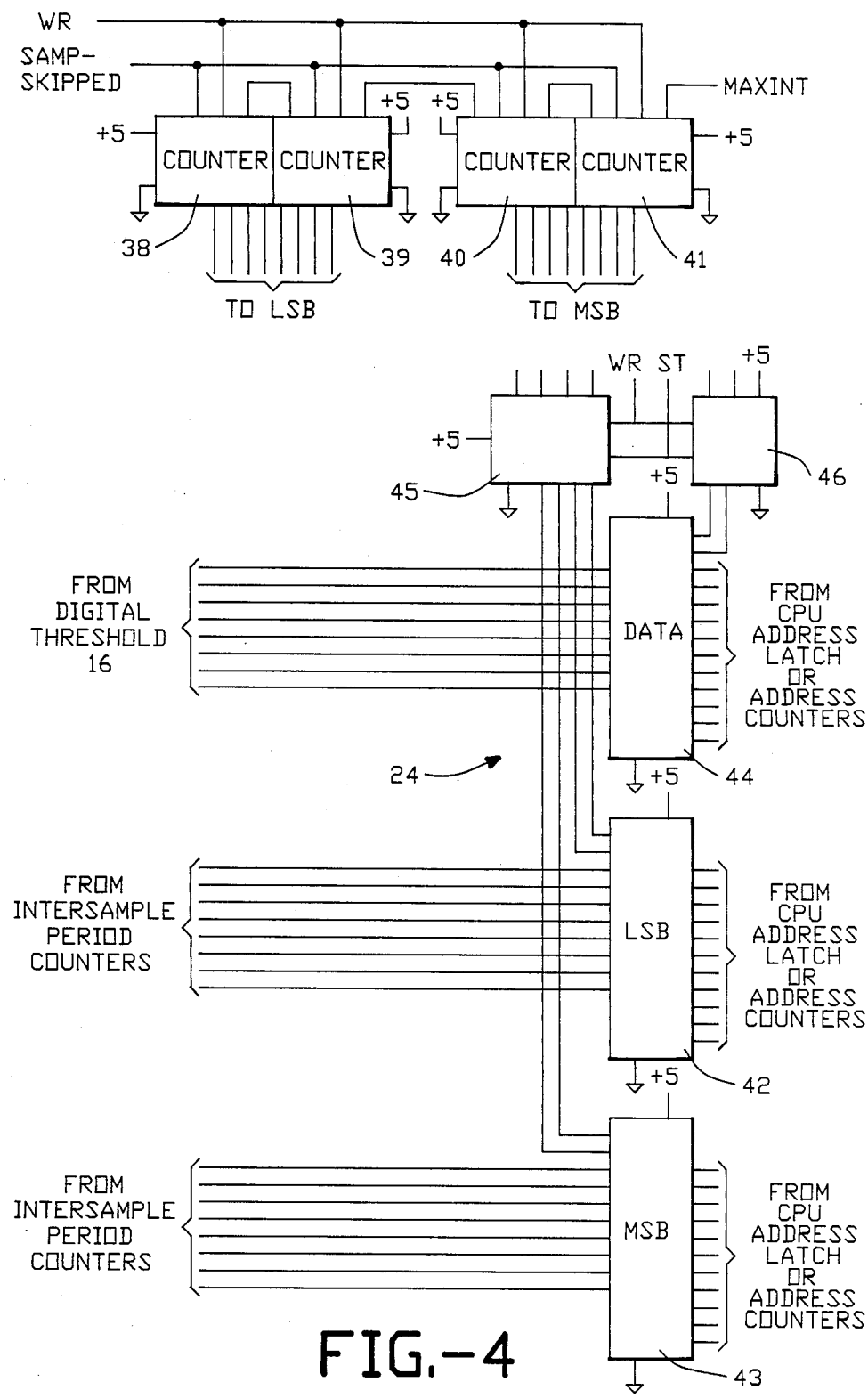
FIG. 4 is a schematic circuit diagram illustrating the intersample period counter used in the network of FIG. 1.

As illustrated in FIG. 4, an intersample period counter 22 as utilized with the circuit of this invention comprises interconnected counter 38, 39, 40 and 41. In operation of the circuit, the counters are set to a zero value by a negative write signal (−WR) received from the clock controlled logic circuit 18. When a sample skipped signal SAMPSKIPPED is received from the logic circuit 18, the counters are incremented by one. The data representing the state of the counters are gated to the memory 24 for storage, simultaneously with data from the analog-to-digital converter 10 that is applied to the latch 20.

The sample SP is stored and the counters are reset to zero value if the maximum interval (MAXINT) that the intersample period counters can store the sample signals has been reached. Also, if the threshold value is exceeded (THRESHEX), the data sample is stored in memory. Either condition causes a write pulse (WR) to be generated whenever the memory is not full. If the maximum interval has not been reached and the threshold has not been exceeded, then the circuit generates a sample skip signal to indicate that the present sample has been skipped and that the sample data is not to be accepted for storage in memory.

If the sample data is to be stored in memory, the data from the counters 38–41 is applied to memory chips 42 and 43. Data from the analog-to-digital converter 10 through the latch 20 is simultaneously stored in memory chip 44. Gates 45 and 46 gate control signals from both the microprocessor and control logic, only one of which is allowed control of the memory chips at a time. A computer or processor (not shown) provides the desired initial address location for storage of sample data to the address counters. The stored data can be accessed by the processor for readout and analysis.

In an implementation of the invention, the actual sample rate of the sampling and storage system varies from 5 MHz to less than 100 Hz. With the threshold set at one, analog-to-digital dithering is prevented from filling the memory with insignificant information. A 60 Hz sinusoidal signal fills the memory at 256 samples per cycle, and a 2K word would store about 8 cycles of data representing approximately 128 milliseconds, resulting in a compression ratio of more than 100 to 1. This compression of data is particularly useful with apparatus that is battery powered and has limited memory capacity but operates with high frequency characteristics.

In the case of a high frequency event, the sample rate shifts to the maximum rate of five MHz. If the high frequency pulse lasts for about 100 microseconds, for example, approximately 500 samples would be processed out of the 2048 words available in memory. However, the longer recording time available with 60 Hz permits accurate definition of the 60 Hz waveform in conjunction with the high frequency pulse.

The adaptive sampling and storage circuit of this invention affords the capture, storage and analysis of high frequency electrical events that affect power distribution networks which operate at low frequencies, such as lightning strikes on electrical utility lines operating at 60 Hz. Since the sampling of data is accomplished digitally, although at a high rate, the effective sampling rate is lowered, by means of the sampling and storage circuit comprising an intersample period counter. Only those data samples are stored that meet the criteria of the SP−SL absolute value difference exceeding the threshold value or the intersample period counter reaching the maximum storage interval. By skipping and not storing those samples that do not meet the necessary criteria, the circuit effectuates high frequency sampling and allows compression of stored data so that optimum use of a relatively small memory is made possible. The circuit is particularly applicable for a battery powered implementation in which it is desirable to limit the battery power used for memory storage. The adaptive circuit is useful for sensing and recording virtually any high frequency phenomenon that impacts low frequency alternating voltages or currents.

We claim:

1. An adaptive circuit for capturing and storing high frequency events of short duration having rapid rise times comprising:

means for receiving an analog signal representative of said high frequency event;

means for digitizing said high frequency analog signal at a first clock frequency to produce present digital data samples;

a latch circuit coupled to said digitizing means for storing said digitized present data samples at a high frequency rate;

comparator means for comparing such present data samples with previously stored data samples of said high frequency signal to produce a difference signal;

storage means for storing the present data sample when the absolute value of said difference signal is greater than a predetermined threshold, and for skipping without recording said present data sample when said difference signal is less than said threshold; said storage means being coupled to the output of said latch and to the output of said intersample period counter for storing a present sample when said comparator indicates that the threshold value has been exceeded by the absolute value of the difference between the present sample and the previous sample, or when the intersample period counter has indicated that the maximum interval during which so present sample has been stored has occurred; and a control logic circuit coupled to the output of said comparator means and to the input circuit of said latch for providing a write signal to said latch.

2. An adaptive circuit as in claim 1, including a clock circuit for providing timing to said digitizing means and to said control logic circuit.

3. An adaptive circuit as in claim 1, including means coupled to the output of said control logic circuit for counting said digitized data samples and for storing a present sample if a maximum interval of predetermined length has occurred without the storage of a present sample.

4. An adaptive circuit as in claim 3, wherein said counting means comprises an intersample period counter comprising a plurality of interconnected counters.

5. An adaptive circuit as in claim 1, including an address counter coupled to the output of said control logic circuit for providing address locations to said memory so that selected register locations of said memory are used for storing incoming sample data.

6. An adaptive circuit as in claim 1, including a plurality of adder circuits coupled to said latch for providing a threshold value against which the absolute value of the difference between the present sample and the previous sample is compared.

7. An adaptive circuit as in claim 1, including an interface between said storage memory and said address counter for determining the memory location at which said incoming samples to said memory are stored.

* * * * *